United States Patent [19]

Fieberg

[11] 4,028,812

[45] June 14, 1977

[54] CONTACT RETENTION TEST TOOL

[76] Inventor: Russell F. Fieberg, 5431 Cerulean Ave., Garden Grove, Calif. 92645

[22] Filed: Jan. 21, 1976

[21] Appl. No.: 651,121

[52] U.S. Cl. .......................... 33/169 B; 73/141 AB
[51] Int. Cl.² ..................... G01B 3/28; G01N 3/14
[58] Field of Search ......... 33/169 R, 169 B, 174 R; 73/94, 141 A, 141 AB

[56] References Cited

UNITED STATES PATENTS

| | | |
|---|---|---|
| 2,401,085 | 5/1946 | LaValley ............................ 33/169 B |
| 2,895,225 | 7/1959 | Eisele ................................ 33/169 B |
| 3,292,430 | 12/1966 | Collier et al. ............................ 73/94 |
| 3,425,271 | 2/1969 | Hendry .......................... 73/141 AB |
| 3,693,418 | 9/1972 | Kaspareck et al. ............ 73/141 AB |

Primary Examiner—Charles E. Phillips
Assistant Examiner—Richard R. Stearns
Attorney, Agent, or Firm—I. Michael Bak-Boychuk

[57] ABSTRACT

A hand tool for verifying the proper installation of pins in the insulation body of a multi-pin connector, said tool including a tubular handle having received on the interior thereof a cylindrical casing. Formed around the periphery of the casing is an exteriorly directed groove communicating through a plurality of radially directed bores with an interior concentric cavity. A plurality of balls are received within the radial bores, each ball being further urged into the interior by an associated follower or bushing. Disposed within the groove around said bushings are two rubber O-rings dimensioned to urge the balls toward the interior cavity. A probe provided with a peripheral ball seat is received within the interior cavity of the casing to be thus retained by the balls in longitudinal translation. The probe then extends through a tubular guide to terminate on the free end thereof in a probe tip which can then be pressed against the male pin of a multi-pin connector.

8 Claims, 5 Drawing Figures

CONTACT RETENTION TEST TOOL

BACKGROUND OF THE INVENTION

1. Field of the Invention

The present invention relates to testing tools and more particularly to a tool which, by way of predetermined force application, verifies the proper installation of closed entry socket contact within the socket insert of an electrical connector.

2. Description of the Prior Art

The assembly of multi-pin connectors in electrical circuits requires many manual steps and for that reason is a constant source of potential failure. One particular assembly step which requires manual operation is the step of inserting the contacts into the dielectric socket insert within the body of the connector. Typically, multi-pin connectors comprise a dielectric socket insert body which is mounted in the connector shell where the connector shell provides the necessary keys for proper connection. During assembly the various pins which carry the circuit across the connector interface are inserted into the socket insert and in particular into the pin openings formed therein. It is this insertion step that is done essentially by feel and the only means for conveniently verifying the proper installation of the pin within the socket body is by way of measurement of the eventual retention forces therein.

As an example, the connectors made by the Bendex Corporation under the model series JT/LJT include within each pin opening an enlarged section into which a spring biased collar formed around the pin is expanded after insertion. This expansion is only possible if the pin assembly is inserted to sufficient depth. In view of the tolerances in the dimensions of each pin assembly and furthermore the distortions of the socket inserts within the shell of the connector, visual inspection or meansurement of the pin projecting dimension does not always provide an indication of proper pin retention. For that reason there have been developed in the past various force application testing tools which can apply a controlled level of force to the end of the pin. If it is found that the pin withstands this level of force, it is then presumed that the pin is properly inserted. The difficulty with these prior art testing tools is that they normally operate on a spring pre-load basis and by excessive articulation may apply forces in excess of the design forces of the connector.

SUMMARY OF THE INVENTION

Accordingly it is the general purpose and object of the present invention to provide a contact retention test tool which is limited in the force that it applies to the contacts.

Further objects of the invention are to provide a contact retention test tool which, by its articulation, will clearly indicate to the user the level of force applied to the contact.

Yet further objects of the invention are to provide a contact retention test tool which is easy to produce, requires few parts and furthermore utilizes elements conventionally available.

Briefly, these and other objects are accomplished within the present invention by providing a hollow tubular handle into which an annular casing is inserted. The annular casing is retained longitudinally within the handle by a shoulder interface and a ring retainer. Formed around the casing, on the surface covered by the handle, is a peripheral groove which, by way of four radial ports, communicates with the interior of the casing. Received within the radial ports are a corresponding plurality of balls conformed for receiving fit in the bores, each ball being further followed by a teflon bushing dimensioned to extend beyond the radial dimensions of the groove. A pair of rubber O-rings is then placed into the groove over the bushing ends, to oppose any externally directed motion of the bushing. The rubber O-rings thus apply a predetermined level of spring force to the free bushing ends, thereby urging the balls towards the interior of the casing. Disposed within the interior of the casing is a cylindrical probe having formed on one peripheral section thereof a ball seat groove into which the respective balls are receivable. The probe is opposed within the interior end of the casing by a helical spring and extend on the other hand beyond the free edge of the casing. In this form any force applied to the free end of the probe of sufficient magnitude to unseat the balls out of the ball seat groove will permit translation of the probe inwardly against the helical spring. When that force is released, the helical spring provides the return force, urging the probe back into its ball receiving alignment. To limit the amount of rearward articulation of the probe there is further provided on the free end of the casing a tubular housing which terminates in a plurality of transverse wing-like structures adapted to engage the free edges of the connector. The longitudinal dimension of this tubular housing is selected such that only a limited length of the probe is exposed.

DESCRIPTION OF THE SPECIFIC EMBODIMENT

While the present invention is illustrated herein in conjunction with a multi-pin electrical connector, such illustration is exemplary only. It is to be noted that uses other than those contemplated herein are possible and no intent to limit the invention by the choice of the example set forth is therefor expressed.

Figure 1:
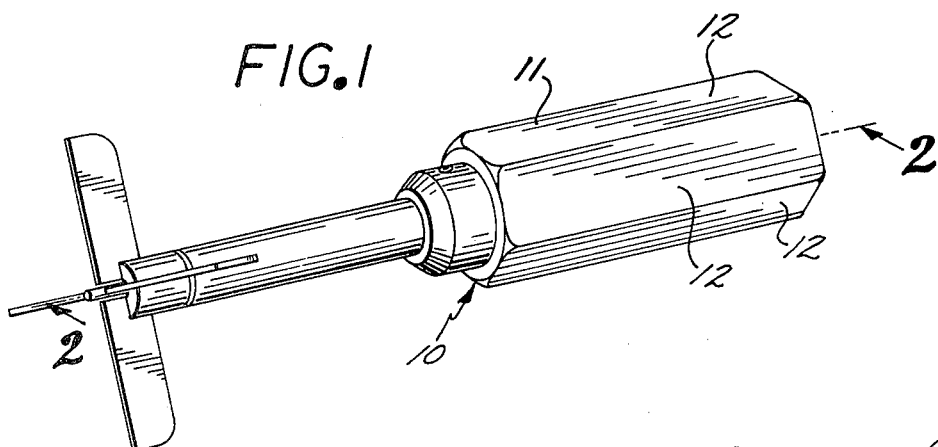
FIG. 1 is a perspective illustration of a contact retention test tool constructed according to the present invention.
Figure 2:
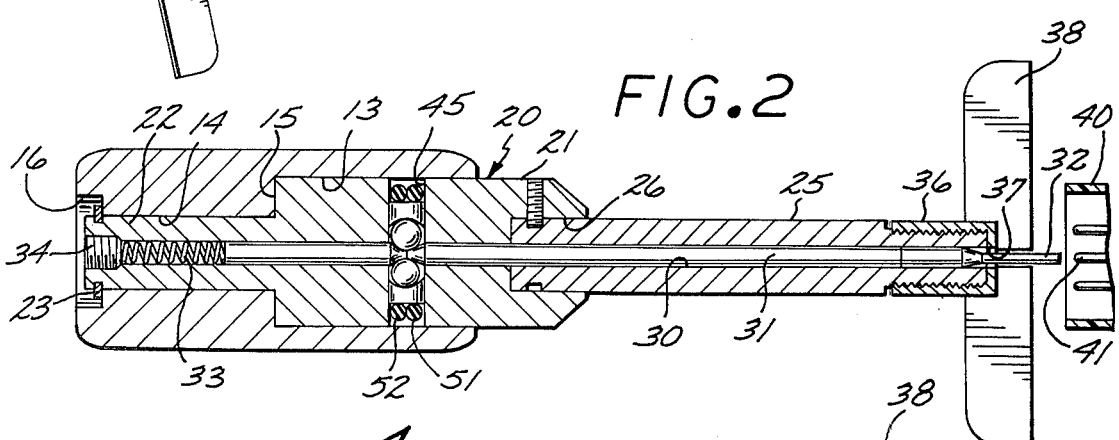
FIG. 2 is a sectional view taken along line 2—2 of FIG. 1.

As shown in FIGS. 1 and 2, a test tool, generally designated by the numeral 10, includes a handle 11 having a plurality of flats 12 on the exterior thereof to assist manual grasping. Handle 11 is generally conformed as a cylinder having a first interior cavity 13 longitudinally aligned therein and a second interior cavity 14 extending axially from the interior end of cavity 13 to the other end of the handle. Cavities 13 and 14 are thus arranged to form a shoulder 15 at their juncture. A cylindrical casing 20 comprising a first cylindrical section 21 conformed for receipt in cavity 13 and a second cylindrical section 22 receivable in cavity 14 is inserted into the handle 11. The free end of section 22 extends beyond the end of cavity 14 into a concentric circular end opening 16 to be engaged thereat by a ring retainer 23. In this manner, once the casing 20 is positioned within the handle 11, the longitudinal articulation thereof is fixed by the combination of the ring retainer 23 and the shoulder 15. In this position, the cylindrical section 21 extends beyond the other end of handle 11.

A tubular guide 25 is partly received within an end cavity 26 formed in the exposed end of section 21 to extend axially from the end of casing 20. Aligned along the common axis of casing 20 and guide 25 is a central bore 30 having received therein a cylindrical probe 31. The sectional dimensions of bore 30 and probe 31 are such that probe 31 is free to articulate on the interior thereof. Formed on one end of probe 31 and projecting beyond the free edge of guide 25 is a reduced diameter probe tip 32. In addition, the other end of probe 31 opposes a helical spring 33 which is retained within the central bore 30 by a threaded plug 34. To preclude a complete withdrawal of probe 31 from within the interior of bore 30 the free end of guide 25 is furthermore provided with a threaded cap 36 having an end opening 37 again axially aligned with the guide which is of a smaller diameter than the sectional diameter of the probe. The probe 31 is thus biased outwardly by spring 33 and is limited in its outward progression by the end cap 36.

Figure 3:
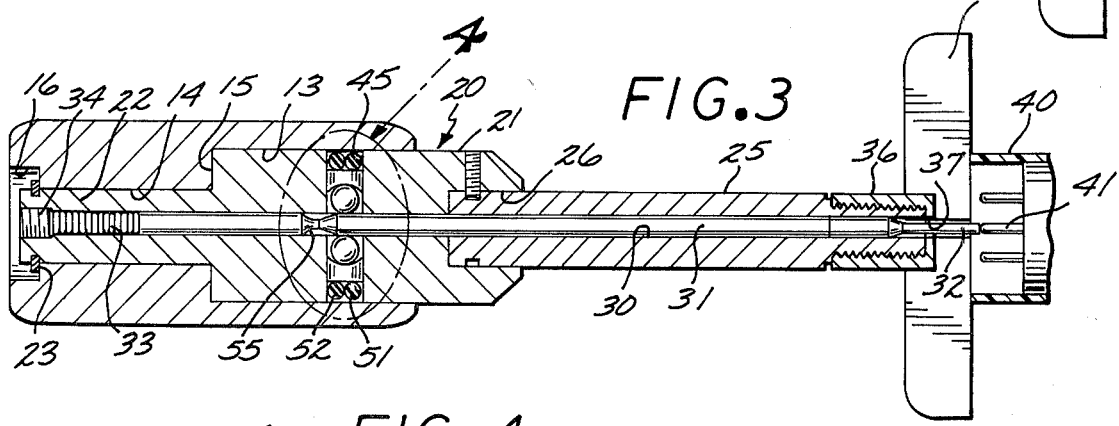
FIG. 3 is yet another sectional view illustrating the inventive testing tool in its dislocated state.
Figure 4:
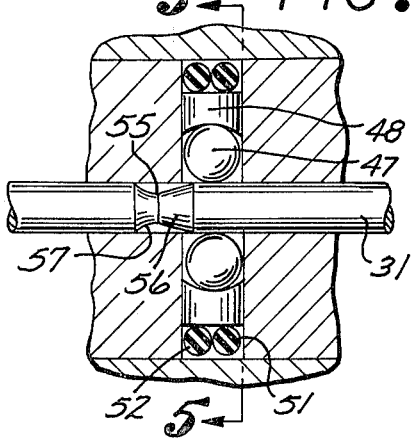
FIG. 4 is a detailed sectional view of the detail labeled "4" in FIG. 3.
Figure 5:
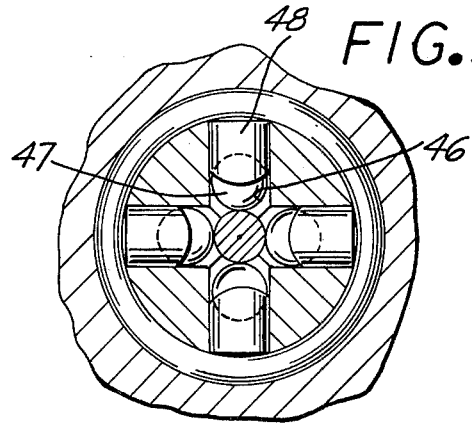
FIG. 5 is yet another sectional view taken along line 5—5 of FIG. 4.

As shown in FIGS. 2 and 3, the probe tip 32 can be placed in opposition against any one pin 41 of a multi-pin connector 40. A plurality of wing-like structures 38 extend from the end cap 36 to align the tool 10 normal to the connector end during this step. To provide for a controlled level of force to the end of pin 41 during this sequence a peripheral groove 45 shown in detail in FIGS. 4 and 5 is formed around the exterior of the casing section 21. The disposition of groove 45 around the exterior of casing 20 aligns the groove within the interior of handle 11. A plurality of radial bores 46 extend from the bottom surface of groove 45 towards the central bore 30, each radial bore 46 receiving a ball 47 followed by a teflon follower or bushing 48 which, on its free or unopposed end partly extends into the groove. Two O-rings 51 and 52 are then positioned in the groove 45 to surround the exposed ends of followers 48, urging such followers and therefore the balls 47 against the lateral surfaces of the probe 31. To provide for a controlled level of retention force by this arrangement probe 31 includes a peripheral ball seat groove 55 longitudinally disposed to engage balls 47 at the extended positions thereof. The level of unseating force in the inward articulation of probe 31 is further controlled by the geometry of seat 55, specifically as a linearly tapered section 56 expanding towards the probe tip and a toroidal surface section 57 on the upper half of the seat groove 55. These features assure a predetermined level of opposing force necessarily for displacement of the probe from its seated position. Once the probe is thus unseated the helical spring 33 provides the requisite lower force levels to return the probe.

With the foregoing description of parts and relationship, the operation of the present invention shall now be set forth. As shown in FIG. 3, when the probe tip 32 achieves a sufficient level of force against the selected pin 41, the balls 47 are unseated from the seat groove 55 allowing for the rearward articulation of the probe. To assure a perpendicular alignment of the tool 10 during this manipulation the wing-like structures 38 on cap 36, at the completion of the inward stroke of probe 31, abut the edge of the connector casing 40. The dimensions of structures 38 at the length of probe 31, are such that opposing contacts between the structures and the connector occurs before spring 33 is fully collapsed. In this manner, application of excessive force through coil bind, normally always present in prior art devices, is avoided. Additionally, an orthogonal alignment of the tool relative the connector is assured by the same structure. Once the pin 41 is thus checked out, the probe is immediately repositioned in the course of alignment with the next pin. In each instance, the manual feel as result of this bottoming-out feature is quite pronounced leaving no doubt in the mind of the user whether a proper test has taken place.

Some of the many advantages of the present invention should now be readily apparent. The invention utilizes O-rings which, by virtue of their normal function, are inherently made to close tolerances, in a manner which is both convenient in use and convenient in assembly. The invention further provides a tool which is inherently reliable and which, in most instances of failure, will fail in a mode not hazardous to the electrical connector tested.

Obviously many modifications and variations to the above disclosure can be made without departing from the spirit of the invention. It is therefore intended that the scope of the invention be determined solely dependent on the claims hereto.

I claim:

1. Apparatus for verifying the proper insertion of pins in a multi-pin connector, comprising:
   a tubular handle;
   an annular casing received in said handle and secured thereto;
   a tubular guide attached to said casing to extend therefrom along a common axis;
   a cylindrical probe telescopically received in said guide and casing;
   advancing means for urging said probe out of said guide and casing;
   a peripheral groove formed around the exterior of said casing in subjacent alignment with said handle;
   a plurality of bores communicating between said groove and the interior of said casing;
   a corresponding plurality of balls each receivable in one of said bores;
   a peripheral ball seat formed on the exterior of said probe for engaging said balls; and
   urging means disposed in said groove and bores for urging said balls against said probe.

2. Apparatus according to claim 1 further comprising:
   an end cap mounted on the free end of said guide including a plurality of radially extending planar members each having a straight edge lying in a plane orthogonal to the axis of said guide.

3. Apparatus according to claim 2 wherein:
   said urging means comprises an O-ring disposed in said peripheral groove and followers received in said bores between said O-ring and said balls.

4. Apparatus according to claim 3 wherein:
   said advancing means includes a helical spring received within said casing for opposing the interior end of said probe at one end thereof and an end plug secured to said casing for opposing the other end of said spring.

5. Apparatus for checking the insertion alignment of pins in a connector having peripheral edges, comprising:

a cylindrical probe;

handle means including a central bore for partly receiving said cylindrical probe on the interior thereof;

a peripheral groove formed around the exterior of said handle means;

a plurality of bores communicating between said groove and said central bore;

a peripheral ball seat formed on said probe in underlying proximity with said bores;

a corresponding plurality of balls received in said bores;

urging means disposed in said groove and bores for urging said balls against said probe; and advancing means mounted in said handle for urging said probe out of said handle.

6. Apparatus according to claim 5 further comprising:

aligning means attached to said handle means to partly surround the exposed end of said probe for opposing said edges of said connector and aligning said handle means normal thereto.

7. Apparatus according to claim 6 wherein:

said ball seat comprises a peripheral recess formed in said probe having a forward surface section having a taper increasing in the direction of the free end of said probe and a rear section having the form of the interior surface section of a toroid.

8. Apparatus according to claim 7 wherein:

said urging means comprises an O-ring disposed in said peripheral groove and followers received in said bores between said O-ring and said balls.

* * * * *